United States Patent
Lin et al.

[11] Patent Number: 6,025,241
[45] Date of Patent: Feb. 15, 2000

[54] METHOD OF FABRICATING SEMICONDUCTOR DEVICES WITH SELF-ALIGNED SILICIDE

[75] Inventors: Tony Lin, Kao Hsiung Hsien; Water Lur, Taipei, both of Taiwan

[73] Assignee: United Microelectronics Corp., Taipei, Taiwan

[21] Appl. No.: 09/073,576

[22] Filed: May 6, 1998

[30] Foreign Application Priority Data

May 26, 1997 [TW] Taiwan ................................. 86107068

[51] Int. Cl.⁷ ........................ H01L 21/336; H01L 21/28
[52] U.S. Cl. ........................ 438/303; 438/305; 438/595; 438/649; 438/655; 438/695; 438/660; 438/664; 438/682; 148/DIG. 147; 257/382; 257/383; 257/757; 257/768; 257/770
[58] Field of Search ................................. 438/230, 301, 438/303, 305, 306, 655, 656, 664, 682, 231, 232, 595, 695, 696, 710, 712, FOR 117, FOR 352, FOR 360, FOR 388, 660; 148/DIG. 147; 257/382, 383, 754, 757, 768, 770

[56] References Cited

U.S. PATENT DOCUMENTS

| | | | |
|---|---|---|---|
| 5,102,816 | 4/1992 | Manukonda et al. | 438/301 |
| 5,416,048 | 5/1995 | Blalock et al. | 438/695 |
| 5,759,901 | 6/1998 | Loh et al. | 438/305 |
| 5,824,588 | 10/1998 | Liu | 438/305 |
| 5,858,848 | 1/1999 | Gardner et al. | 438/305 |
| 5,879,999 | 3/1999 | Park et al. | 438/304 |

*Primary Examiner*—Mary Wilczewski
*Assistant Examiner*—Yung A. Lin
*Attorney, Agent, or Firm*—Thomas, Kayden, Horstemeyer & Risley

[57] ABSTRACT

A method for fabricating a semiconductor device, such as a MOS (metal-oxide semiconductor) transistor, with self-aligned silicide is provided. This method can prevent junction leakage between the silicide and the substrate so as to allow the resultant semiconductor device to have reliable performance. The method includes the steps of preparing a semiconductor substrate; forming at least one transistor element over the substrate, the transistor element including a pair of source/drain regions, a gate, a dielectric layer over the gate, and a spacer on the sidewall of the gate; and performing an ion-bombardment process so as to transport one part of the dielectric layer that is adjacent to the top of the spacer to beside the bottom of the spacer. Through this method, the resultant semiconductor device is reliable in operation since the drawback of the occurrence of leakage current or short-circuit that could be otherwise resulted between the self-aligned silicide and the substrate owing to the short-channel effect can be eliminated. Moreover, the resultant semiconductor device has increased anti-static capability that can protect the semiconductor device against electro-static damage.

15 Claims, 4 Drawing Sheets

METHOD OF FABRICATING SEMICONDUCTOR DEVICES WITH SELF-ALIGNED SILICIDE

CROSS-REFERENCE TO RELATED APPLICATION

This application claims the priority benefit of Taiwan application serial no. 86107068, filed May 26, 1997, the full disclosure of which is incorporated herein by reference.

BACKGROUND OF THE INVENTION

1. Field of the Invention

This invention relates to semiconductor fabrication processes, and more particularly, to a method of fabricating a semiconductor device with self-aligned silicide, which can help prevent the occurrence of junction leakage in the semiconductor device due to a downsizing of the line width of the semiconductor device and also help increase the anti-static capability of the semiconductor device against electro-static damage.

2. Description of Related Art

The self-aligned silicide (usually referred to as "salicide") process is customarily utilized in the fabrication of VLSI (very large-scale integration) integrated circuit with a line width less than 0.5 μm (micrometer). A conventional method for fabricating a semiconductor device with self-aligned silicide is illustrated and described in the following with reference to FIGS. 1A through 1C.

Referring first to FIG. 1A, in the first step, a raw semiconductor wafer, such as a silicon substrate 10, is prepared. Over the substrate 10, a semiconductor device, such as a MOS (metal-oxide semiconductor) transistor is formed, which includes a polysilicon gate 11, a pair of source/drain regions 12, and spacers 13. Subsequently, a metallization layer 14 is deposited over the entire top surface of the wafer to a thickness of from 200 Å(angstrom) to 1,000 Å.

Referring next to FIG. 1B, in the subsequent step, the wafer is subjected to heat treatment, whereby part of the metal in the metallization layer 14 is reacted with the silicon in the source/drain regions 12 and the polysilicon in the gate 11, thus forming metal silicide 15 over the gate 11 and the source/drain regions 12.

Referring further to FIG. 1C, in the subsequent step, a selective wet-etching process is performed on the wafer so as to remove the unreacted part of the metal in the metallization layer 14. The remaining metal silicide layers 15 are the so-called self-aligned silicide.

Through the foregoing process, as illustrated in FIG. 1C, the resultant metal silicide layers 15 are separated away from the substrate 10 only by a thin portion of the source/drain regions 12, as indicated by the reference numeral 16.

As component size is downsized for increased integration, the length of the channel between the source and drain regions of the MOS transistors is correspondingly shortened. This allows an increase in the operating speed of the MOS transistors. However, there is still a limit to the channel length of the MOS transistors. When the channel is shortened to less than a certain length, the threshold voltage of the MOS transistors will be lowered to a level that causes the so-called short-channel effect. This effect is particularly evident in the thin portion 16 of the source/drain regions 12 that separates the metal silicide layers 15 from the substrate 10 illustrated in FIG. 1C. The shortened channel length will cause junction leakage current from the metal silicide layers 15 through this thin portion 16 of the source/drain regions 12 to the substrate 10.

Moreover, the shortened channel will allow some electrons near the junction between the channel and the drain to gain energy and thus become the so-called hot electrons. These hot electrons will then strike on other electrons, whereby increased number of electron-hole pairs are produced. This can cause the undesired effect of electrical breakdown and thus breakthrough, in the MOS transistors, which significantly affects the reliability and performance of the MOS transistors.

SUMMARY OF THE INVENTION

It is therefore a primary objective of the present invention to provide a method for fabricating a semiconductor device with self-aligned silicide which can prevent the junction leakage between the self-aligned silicide and the substrate so as to allow the resultant semiconductor device to have reliable performance.

In accordance with the foregoing and other objectives of the present invention, a method for fabricating a semiconductor device with self-aligned silicide is provided. The method of the invention, broadly speaking, includes the following steps of.

(1) preparing a semiconductor substrate;

(2) forming at least one transistor element over the substrate, the transistor element including a pair of source/drain regions, a gate, a dielectric layer formed over the gate, a spacer formed on the sidewall of the gate; and (3) performing an ion-bombardment process so as to transport one part of the dielectric layer that is adjacent to the top of the spacer to beside the bottom of the spacer;

(4) forming a metallization layer over the dielectric layer and the source/drain regions; and (5) performing a heat-treatment process so as to form self-aligned silicide layers over the dielectric layer and the source/drain region.

Through the method of the invention, the resultant semiconductor devices are reliable in operation since the drawback of the occurrence of leakage current or short-circuit that could otherwise be resulted between the self-aligned silicide and the substrate owing to the short-channel effect can be eliminated. Moreover, the resultant semiconductor device has increased anti-static capability that can protect the semiconductor device against electro-static damage.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIG. 2A through FIG. 2D are schematic sectional diagrams used to depict the steps involved in the method of the invention for fabricating a MOS (metal-oxide semiconductor) transistor with self-aligned silicide. This method can help prevent the occurrence of junction leakage between the self-aligned silicide and the silicon substrate due to a downsizing of the semiconductor device and also help increase the antistatic capability of the MOS transistor against electro-static damage.

Figure 2A:
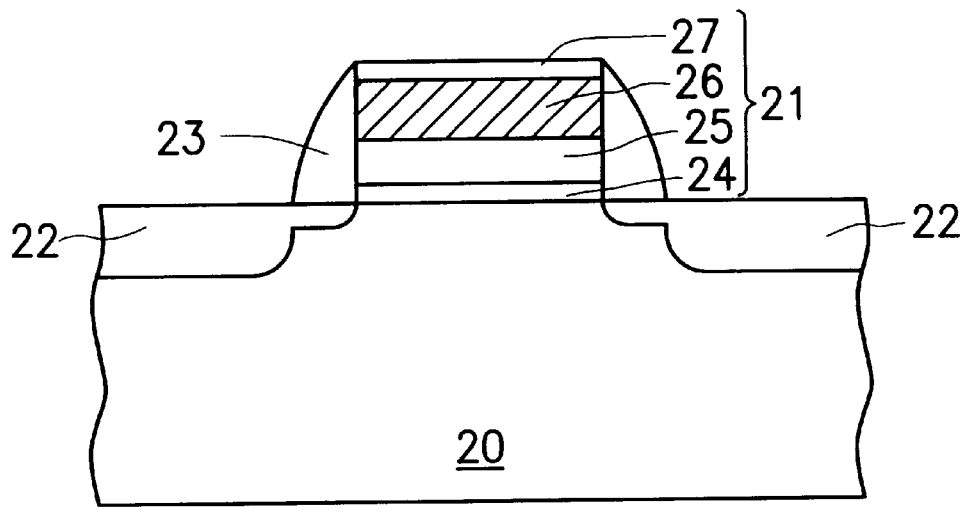
FIGS. 2A through 2D are schematic sectional diagrams of semiconductor structures used to depict the steps involved in the method of the invention for fabricating a MOS transistor with self-aligned silicide.

Referring first to FIG. 2A, in the first step, a raw semiconductor wafer, such a silicon substrate 20, is prepared. Over the substrate 20, a plurality of MOS transistors are formed (only one is shown in FIG. 2A), each including a pair of source/drain regions 22, a gate 21 on the channel region, and a spacer 23 formed on the sidewall of the gate 21.

The source/drain regions 22 are constructed by first forming lightly doped drain (LDD) regions, and then doping the LDD regions with more dopants to form heavily doped source/drain regions. This can help prevent the short-channel effect.

The gate 21 is formed by first forming an oxide layer 24; then depositing a first conductive layer 25, such as a doped polysilicon layer, over the oxide layer 24; and finally depositing a second conductive layer 26 over the first conductive layer 25. The second conductive layer 26 can be a layer of an alloy of tungsten and silicon (WSi) with a barrier layer between W and poly, a layer of tungsten (W), the barrier layer can be a layer of titaniumnitride (TiN), a layer of titanium silicide (TiSi$_2$), or a layer of tungsten nitride (WN). Next, a dielectric layer 27, such as an oxide layer or a nitride layer, is formed over the second conductive layer 26. The oxide layer 24, the first conductive layer 25, the second conductive layer 26, and the dielectric layer 27 in combination constitute the gate 21 of the MOS transistor.

Figure 2B:
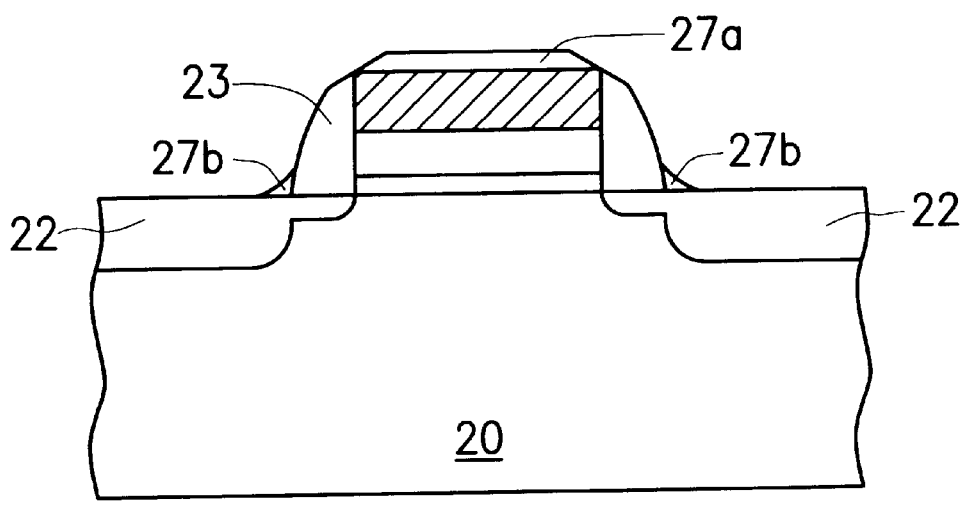

Referring next to FIG. 2B, in the subsequent step, an ion-bombardment process is performed on the wafer, whereby a small part of the dielectric layer 27 that is adjacent to the top of the spacer 23 is transported to beside the bottom of the spacers 23. The remaining part of the dielectric layer 27 over the second conductive layer 26 is hereinafter referred to as the "top dielectric layer" and designated by the reference numeral 27a, while the transported part of the dielectric layer 27 beside the bottom of the spacers 23 are hereinafter referred to as the "bottom dielectric layer" and designated by the reference numeral 27b.

The ion-bombardment process can be an anisotropic plasma or a high-density plasma (HDP) ion-bombardment process. In the HDP ionbombardment process, for example, argon ions with a pressure of from 100 mTorr to 500 mTorr and a flow rate of 300 sccm (standard cm$^3$ per minute) to 1,000 sccm are applied under an electric power of from 500 W (watt) to 1,500 W for a duration of from 10 to 60 seconds.

Figure 2C:
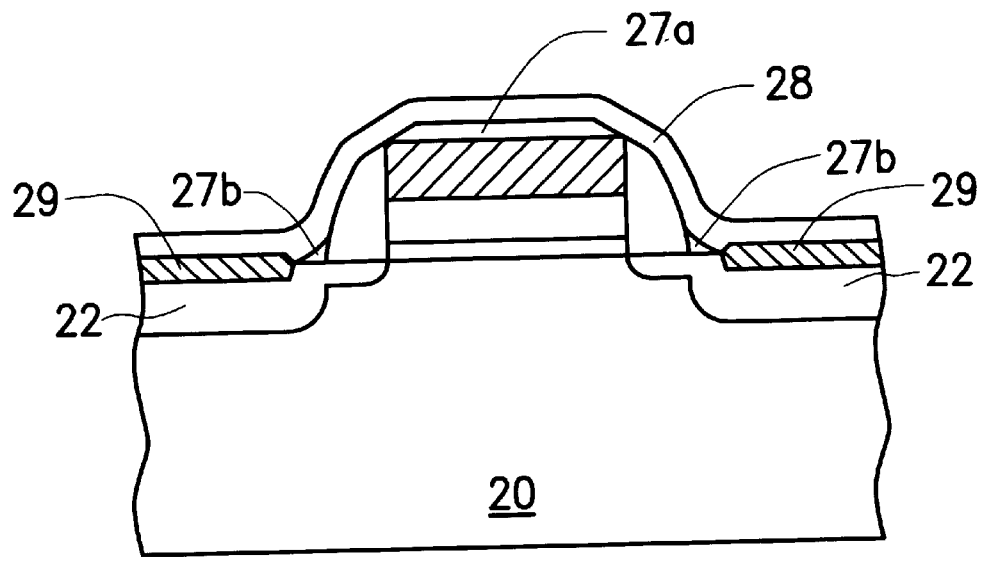

Referring next to FIG. 2C, in the subsequent step, a metallization layer 28, such as a metallization layer of titanium, is formed over the entire top surface of the wafer. After this, the wafer is subjected to heat treatment, whereby part of the metal in the metallization layer 28 is reacted with the silicon in the source/drain regions 22, thus forming a layer of metal silicide 29 (which is a layer of titanium silicide in the case of the metallization layer 28 being a metallization layer of titanium) over the source/drain regions 22.

Figure 1A:
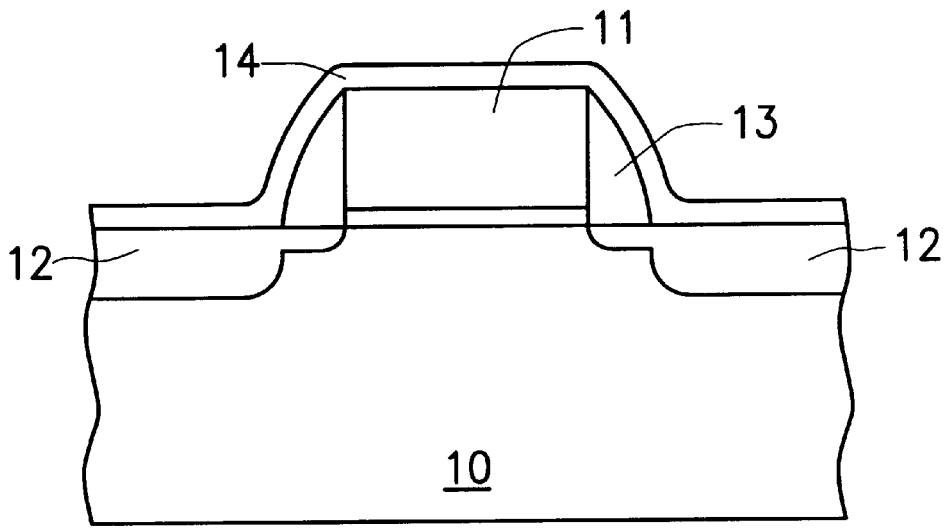
FIGS. 1A through 1C are schematic sectional diagrams of semiconductor structures used to depict the steps involved in a conventional method for fabricating a MOS transistor with self-aligned silicide.
Figure 1B:
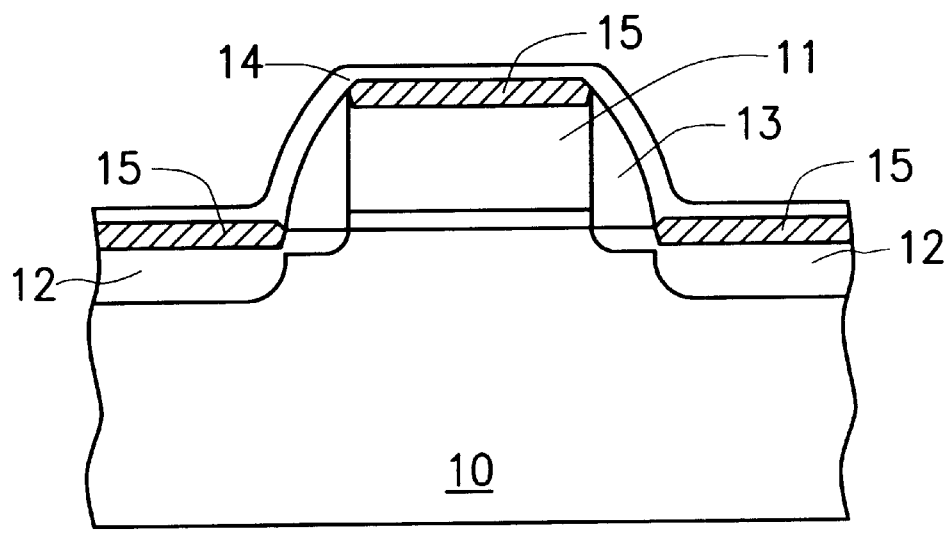
Figure 1C:
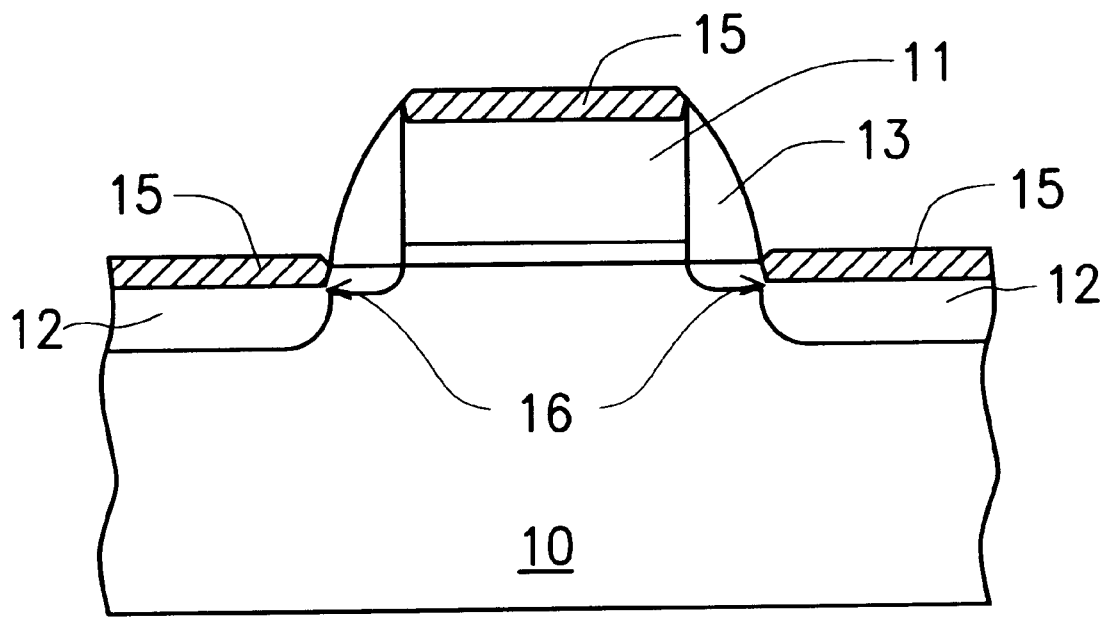

During the heat-treatment process, the bottom dielectric layer 27b resulted from the ion-bombardment process can serve as an isolator for preventing the reaction between the metallization layer 28 and the part of the source/drain regions 22 that is covered by the bottom dielectric layer 27b. As a result, the separating distance between the metal silicide layers 29 and the substrate 20 is increased compared to the thin portion 16 shown in the priorart of FIG. 1C. The drawback of the occurrence of leakage current or short-circuit at the junction between the silicon substrate and the metal silicide layers as described in the background section of this specification can thus be eliminated.

Figure 2D:
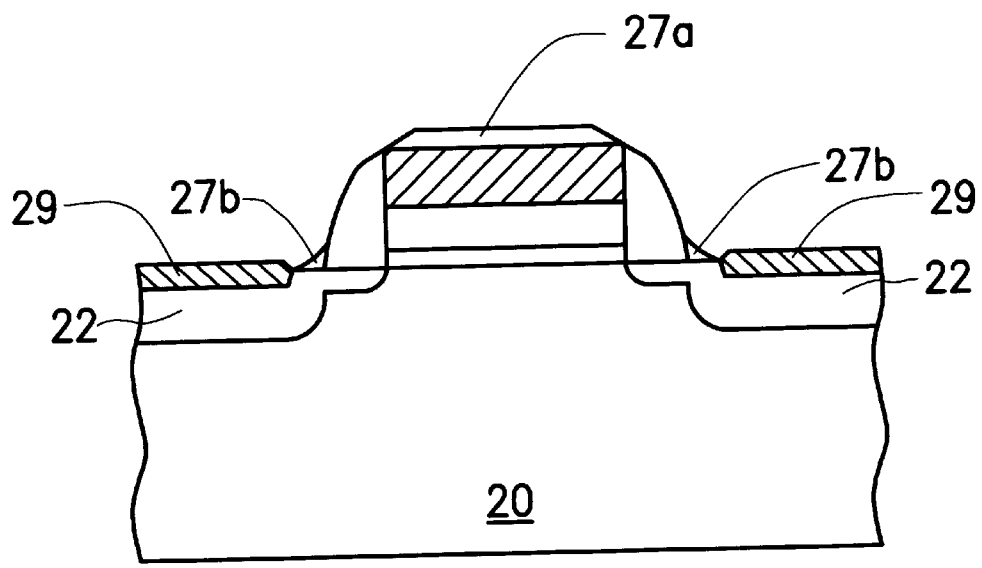

Referring further to FIG. 2D, in the subsequent step, an etching process is performed on the wafer so as to remove the unreacted part of the metallization layer 28. Through this process, however, the metal silicide layers 29 over the source/drain regions 22 are not removed. This completes the fabrication of the MOS transistor.

From the foregoing description, it can be learned that the invention has the following advantages. First, the resultant MOS transistor is more reliable in operation since the drawback of the occurrence of leakage current or short-circuit that could be resulted owing to the short-channel effect can be eliminated. Second, the resultant MOS transistor has increased anti-static capability that can protect the MOS transistor against electro-static damage. Third, the ion-bombardment process used in the method of the invention allows a pre-amorphization effect on the wafer, which can facilitate the forming of the self-aligned silicide in the subsequent steps. Fourth, the method of the invention can be carried out in compatibility with the self-aligned contact (SAC) process which is an essential semiconductor fabrication process for VLSI integrated circuits.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor fabrication process, comprising the steps of:

(1) preparing a semiconductor substrate;
   (2) forming at least one transistor element over the substrate, the transistor element including a pair of source/drain regions, a gate, a dielectric layer formed over the gate, and a spacer formed on the side-wall of the gate; and
   (3) performing an ion-bombardment process so as to transport one part of the dielectric layer that is adjacent to the top of the spacer to beside the bottom of the spacer;
   (4) forming a metallization layer over the dielectric layer and the source/drain regions; and
   (5) performing a heat-treatment process so as to form self-aligned silicide layers over the dielectric layer and the source/drain region.

2. The method of claim 1, further comprising the steps of:

performing a deposition process so as to form a metallization layer over the entire top surface of the wafer;
   performing a heat-treatment process so as to allow part of the metal in the metallization layer to react with the silicon in the source/drain regions to form a metal silicide layer over the source/drain regions; and
   performing an etching process so as to remove the unreacted part of the metallization layer.

3. The method of claim 1, wherein the gate is formed by the steps of:

forming an oxide layer over a selected region on the substrate;

forming a first conductive layer over the oxide layer;

forming a second conductive layer over the first conductive layer; and forming the dielectric layer over the second conductive layer.

4. The method of claim 3, wherein the first conductive layer is a layer of doped polysilicon.

5. The method of claim 3, wherein the second conductive layer is a layer of metal silicide.

6. The method of claim 3, wherein the second conductive layer is a layer of titanium silicide.

7. The method of claim 3, wherein the second conductive layer is a metallization layer of tungsten.

8. The method of claim 3, wherein the second conductive layer is a layer of tungsten and an alloy of tungsten and silicon (W/WSi).

9. The method of claim 3, wherein the second conductive layer is a layer of titanium nitride.

10. The method of claim 3, wherein the second conductive layer is a layer of tungsten nitride.

11. The method of claim 1, wherein the dielectric layer is an oxide layer.

12. The method of claim 1, wherein dielectric layer is a nitride layer.

13. The method of claim 1, wherein the ion-bombardment process is an anisotropic plasma ion-bombardment process.

14. The method of claim 1, wherein the ion-bombardment process is a high-density plasma ion-bombardment process.

15. The method of claim 1, wherein the ion-bombardment process utilizes a source of argon ions with a pressure of from 100 mTorr to 500 mTorr and a flow rate of 300 sccm (standard $cm^3$ per minute) to 1,000 sccm, which is applied under an electric power of from 500 W (watt) to 1,500 W for a duration of from 10 to 60 seconds.

* * * * *